United States Patent [19]

Retter

[11] Patent Number: 5,514,866
[45] Date of Patent: May 7, 1996

[54] SWITCH ASSEMBLY

[75] Inventor: Dale J. Retter, Scottsdale, Ariz.

[73] Assignee: Industrial Innovations, Inc., Scottsdale, Ariz.

[21] Appl. No.: 130,733

[22] Filed: Oct. 4, 1993

[51] Int. Cl.[6] .......................... H01J 40/14; H03M 11/06
[52] U.S. Cl. ...................... 250/221; 335/206; 250/578.1
[58] Field of Search .................... 200/5 R, 5 A, 200/5 E, 5 EA, 5 EB, 6 A; 335/1–5, 205–208; 400/472–495; 250/221, 229, 229.13, 239, 227.22, 227.11, 227.21; 341/21, 22, 31, 34

[56] References Cited

U.S. PATENT DOCUMENTS

| | | | |
|---|---|---|---|
| 2,532,228 | 11/1950 | Hesh | 400/485 |
| 3,633,724 | 1/1972 | Samuel | 400/485 |
| 3,736,397 | 5/1973 | Pedersen | 200/5 R X |
| 3,761,016 | 9/1973 | Pedersen | 335/206 X |
| 3,916,360 | 10/1975 | Pedersen et al. | 335/205 |
| 3,965,315 | 6/1976 | Wuenn | 200/6 A |
| 4,251,723 | 2/1981 | Speidel et al. | 250/229 |
| 4,265,557 | 5/1981 | Runge | 400/479 |
| 4,479,111 | 10/1984 | Madsen | 250/229 X |
| 4,517,424 | 5/1985 | Kroczynski | 200/5 R X |
| 4,584,443 | 4/1986 | Yaeger | 200/6 A |
| 4,913,573 | 4/1990 | Retter | 400/489 |
| 4,917,516 | 4/1990 | Retter | 400/489 |

OTHER PUBLICATIONS

Xerox Journal, vol. I, No. 2, Feb. 1986 (p. 85).

Primary Examiner—J. R. Scott
Attorney, Agent, or Firm—LaValle D. Ptak

[57] ABSTRACT

A modular switch assembly comprises a multiple switch configuration operated by a single finger. The assembly consists of a base member with a push-button or plunger switch located on its top. Four upright switch operators extend above the surface of the push-button switch for contact by movement of a finger in any of four directions 90° angularly offset from one another. These upright switch operators normally are magnetically biased to a first position, located near the push-button switch. They are operated by the finger to a second position, by rocking them outwardly from the first position. All of the parts snap fit together; and there are no mechanical springs or hinge assemblies to hold the various switch parts together. Movement of any of the switch operators, from a first position to a second position, is sensed by means of a light-source/photocell combination, the light path of which is blocked when the switch operators are in one of the two positions, and which is opened when the switch operators are in the other of the two positions.

20 Claims, 2 Drawing Sheets

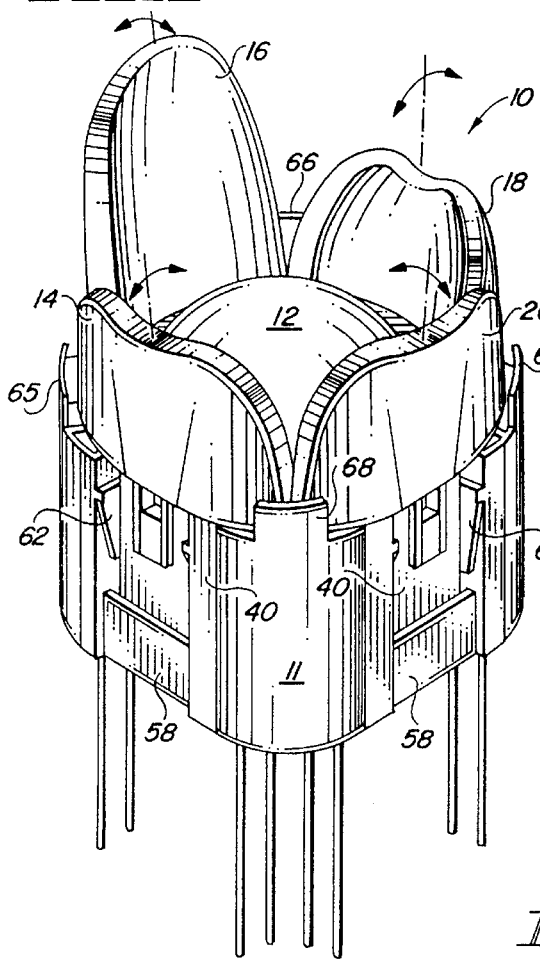
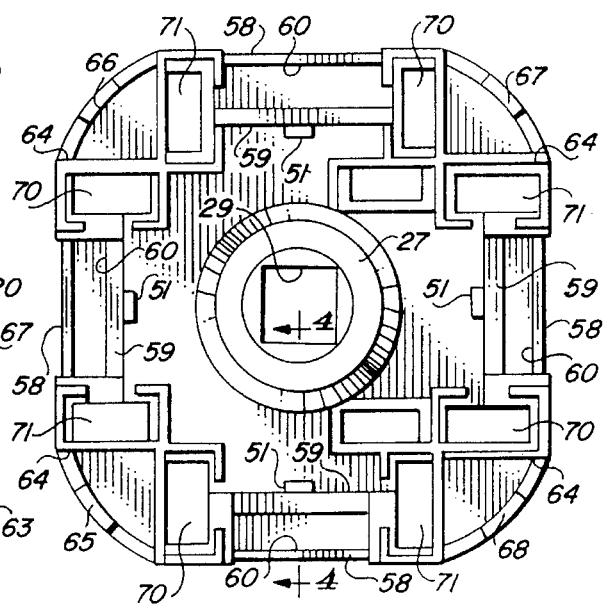
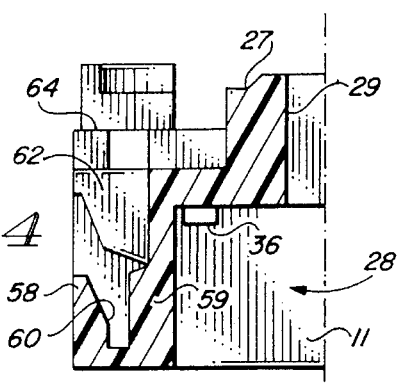
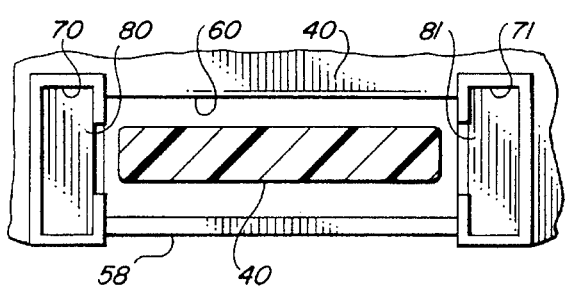
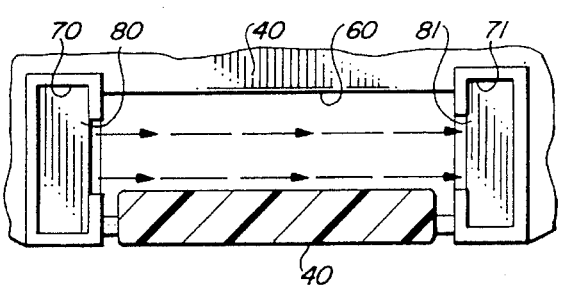

SWITCH ASSEMBLY

BACKGROUND

At the present time, word processors and computers primarily rely upon data entry keyboards and various types of spatial devices for inputing information into the computer or word processor, for subsequent display and/or printing. The now standard keyboard, used in conjunction with computers, typewriters and word processors, has what is known as the "QWERTY" key arrangement. The keys are arranged in multiple horizontal rows across the keyboard; and the key arrangement requires the user of the keyboard to use finger and hand motions which extend over the rows and from side to side during the data input operation.

The "QWERTY" arrangement of the letters of the alphabet resulted from some unique characteristics of the all-mechanical typewriters, which existed at the time this arrangement was invented. Because of the nature of the mechanical operation of the typewriter, the "QWERTY" keyboard arrangement was developed to place the most commonly used letters in English at the opposite sides of the type basket. The keyboard then was laid out to provide direct mechanical connections to the various letters; so that many of the commonly used letters were placed away from the "home" (center) row, where the fingers normally rested. In addition, the "QWERTY" keyboard was designed with another slow-down technique by causing common letter pairs to be struck by the same finger on the same hand. This is the slowest motion for successive letters which could be developed, in order to prevent possible jamming of the typewriter. This arrangement, however, is not efficient; and it requires a considerable amount of finger movement in the operation of the keyboard. Modern electric typewriters and computers no longer have a mechanical link between the keys and the final printing function; so that the "QWERTY" arrangement no longer is necessary. However, because of the widespread mastery by secretaries and data input operators of the "QWERTY" system, even after the reasons for its original development no longer are applicable, such keyboards continue to be used.

Over the years, non-standard keyboard character assignments have been developed to provide a more efficient layout than the standard "QWERTY" keyboard; but these non-standard keyboard arrangements have not been accepted. This is primarily due to the minimal advantages which are obtained from such keyboard assignments over the standard "QWERTY" arrangement; so that no overriding reason has been presented to the industry to modify the well established and well known "QWERTY" keyboard arrangement.

In recent years, with the extensive use of computers as data entry devices and as word processors and the like, it has become common for secretaries and other computer users to spend many hours of the day typing on the keyboard. Since most keyboards do not provide any type of hand support, persons using such keyboards over an extended period of time experience fatigue or strain in the arms, wrists and fingers. In many cases, which are becoming increasingly prevalent, the strain results in carpal tunnel injuries, because of the extensive use of the long tendons passing through the carpal tunnel in the wrist. In extreme cases, these injuries result in extreme inflammation of the wrists, making the typing motions painful, and in some cases, impossible. The reason is that the hands are not in a relaxed and natural position, and the long finger movement reaches cause continuous movement of the tendons in the carpal tunnel. Once the inflammation becomes serious, many workers are permanently incapacitated.

For different reasons, different approaches have been undertaken in the past to provide multiple switches or key assignments at each of several different fixed finger locations. One such approach is disclosed in the U.S. Pat. No. 2,536,228 to Hesh. This patent is for an electronically operated typewriter, in which the keyboard location of the typewriter has been modified to provide two groups of five semi-circular keys. These keys underlie the thumb and forefingers, respectively, of the left and right hands. Each key may be operated by pivoting it forward, backward, left, right, or by pushing it straight down to obtain five different outputs from each key position. These outputs then are used to operate the otherwise conventional mechanism of the electric typewriter. Similar arrangements are shown in the U.S. Pat. No. 3,633,724 to Samuel (for a typewriter) and U.S. Pat. No. 3,965,315 to Wuenn (for a calculator). The Samuel typewriter employs only eight pivoted keys, and utilizes the conventional space bar, return and shift keys normally associated with standard typewriter keyboards. The switch arrangements of each of these keys, for obtaining the desired outputs, are relatively complicated.

A variation of the multiple switch location for each finger is disclosed in the keyboard of the U.S. Pat. No. 4,265,557 to Runge. The system of this patent provides clusters of keys operated by each finger. The keys of the cluster are closely associated around the finger in its "home" row position. One key rests above the operator's finger, and is operated by raising the finger. There also are keys behind and in front of the conventional "home" row key; so that each finger is capable of operating four different keys or switches from the "home" row position. The Runge device "locks" the fingers into narrowly defined locations, without providing physical support or tactile feedback for the hands and arms to maintain the precise locations required. The Runge device is a relatively complex set of mechanical lever arms, subject to mis-adjustment and wear.

A conceptual illustration of a semi-captive keyboard, employing multiple key positions from each of the fixed finger positions, is shown in the Xerox Journal, Vol. 1, No. 2, February 1986 (page 85). No details of the switch construction are shown; but essentially, the device comprises a generally flat plate, on which the hand is placed palm down, with the fingers and thumb extended. The fingers and thumb appear to enter openings in a vertical raised portion adjacent the flat palm-receiving portion. In these openings, clusters of keys are placed around the fingers for operation by each finger. No details of the keys, or of the switches operated by them, are illustrated. This disclosure lacks sufficient details for implementation into an operative device.

The U.S. Pat. No. 4,584,443 to Yaeger and the French patent No. 82/01345 to Kroczynski are directed to an entirely different type of data input device. In Yaeger and Kroczynski, elongated bars are worn on the hands of an operator. In Yaeger, the ends of the fingers of the operator are inserted into circular cups, which captivate or hold the fingers within the cups. Each cup, in turn, is mounted on a spring to permit rocking motion in any one of two or three directions, and in some cases, downward or forward movement as well. Thus, each cup may be considered to be a multiple switch arrangement. As constructed, the device of Yaeger always must return the cup to its neutral or home position before it can be used to actuate a switch in any other direction. The fingertips or fingers of the operator of the Yaeger device are held captive in continuous contact with a single key or switch. The Yaeger device essentially is "worn" by the operator, since it attaches to the hands like a glove, with the thumb being completely encased in a rigid tube. In Kroczynski, the fingers fit within an enclosure; so different parts of each finger operate different switches. Both of these devices are complex arrangements, difficult to use, difficult to manufacture, and subject to wear.

The U.S. Pat. No. 4,915,573 to Retter is directed to an alphanumeric keyboard, in which the keyboard itself is divided into two sections. Each section has a raised central portion for ergometrically supporting and steadying the hand of the operator in a relaxed natural position. Each of the fingers and the thumb extend into cavities, which have a plurality of push-button key switches arranged in them. For the fingers, these cavities have a push-button switch in the bottom, and four switches located on the left, right, front and back sides of the cavity for operation by a finger placed into the cavity. The details of the switches are not shown; but all of them are illustrated as push-button switches, which are indicated as being of any suitable type commonly used with data input keyboards to close circuits to supply signals to processing circuitry. The mechanical structures of these switches are not shown.

It is desirable to provide an improved switch module, which may be used in conjunction with a system such as disclosed in the Retter patent, which is compact in size, easy to use, easy to construct, and long lasting in operation.

SUMMARY OF THE INVENTION

It is an object of this invention to provide an improved switch assembly.

It is another object of this invention to provide an improved modular switch assembly.

It is an additional object of this invention to provide an improved modular multiple switch assembly.

It is a further object of this invention to provide an improved modular multiple switch assembly in which the parts are snapped together and which does not require springs, hinges or combinations of levers in its operation.

In accordance with a preferred embodiment of this invention, a modular switch assembly includes a base member, which has a plurality of switch operator members carried on it. The switch operator members are movable from a first position to a second position. Magnetic biasing is employed normally to maintain the switch operating members in a first position, and to return the switch operating members to the first positions after movement to the second position has been released. A device is provided for detecting the position of the switch operating members to provide an output indicative of that position.

BRIEF DESCRIPTION OF THE DRAWINGS

FIG. 1 is a perspective view of a preferred embodiment of the invention in its assembled form;

FIG. 3 is a top view of a portion of the embodiment shown in FIG. 2;

FIG. 4 is a cross-sectional view taken along the line 4—4 of FIG. 3; and

FIGS. 5 and 6 are enlarged top detailed views illustrating a feature of the embodiment shown in FIGS. 1 through 4.

DETAILED DESCRIPTION

Figure 2:
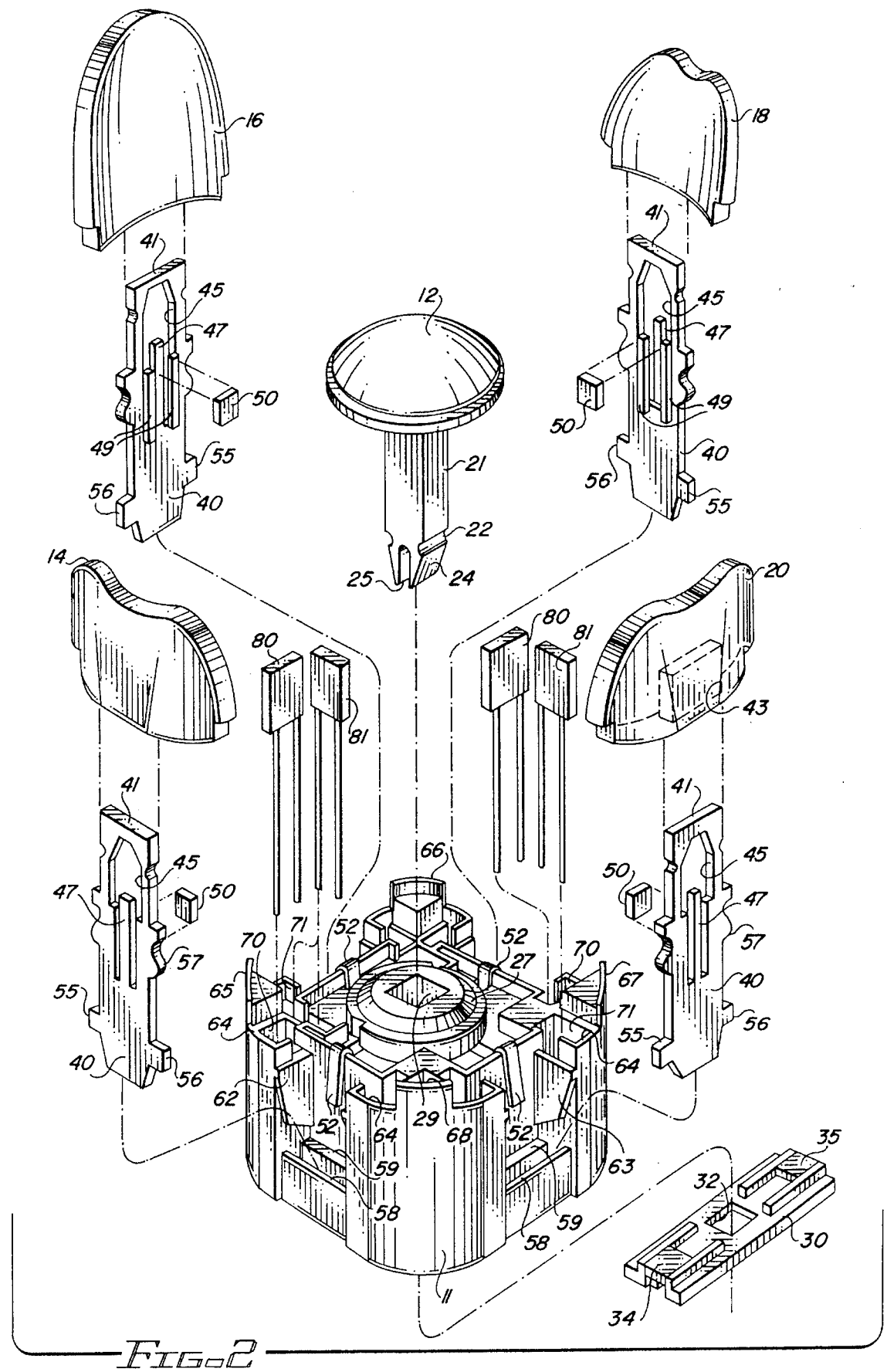
FIG. 2 is an exploded view of the embodiment of FIG. 1.

Reference now should be made to the drawings, in which the same reference numbers are used throughout the different figures to designate the same components. As illustrated in FIG. 1, a modular switch assembly, which is particularly useful in the alpha-numeric keyboard disclosed in U.S. Pat. No. 4,913,573 mentioned above, is shown. This modular key switch assembly is capable of use in each of the finger well positions disclosed in U.S. Pat. No. 4,913,573, the specification of which is incorporated herein by reference.

In use, the modular switch assembly 10 is placed to receive the tip of a finger, which is inserted onto the top of a central push-button switch operator 12, and which is then surrounded by upright switch operator members 14, 16, 18 and 20. The switch operator members 14 and 16 are located on diametrically opposite sides to be operated by opposite sides of a finger which is placed between them and resting on top of the push-button switch 12. The taller operating lever 16 is arranged to be engaged by movement of the finger in a forward or outward direction; and the switch operator member 20 is engaged by the finger when it is pulled backward toward the wrist of the operator. All of these switch operators are pivotally held on a base member or housing 11, which preferably is made of molded plastic material in a single piece.

FIG. 2 most clearly shows the manner of assembly and the structure of the modular switch assembly, illustrated in FIG. 1 in its fully assembled form. As shown in FIG. 2, the base member 11 has a central portion 27, with a square-shaped aperture 29 extending entirely through the housing 11 and opening on the underside in an enlarged cavity 28 (shown most clearly in FIG. 4). Beneath the circular finger contact switch operator portion 12 is an elongated projection 21 having a square cross section to slidably fit within the aperture 29 through the center of the housing 11. The lower end of the projection 21 has a pair of transverse notches 22, formed on opposite sides, adjacent a tapered surface 24 with a slot 25 formed in the bottom of the projection 21. To assemble the push-button switch operator 12, the projection 21 is inserted through the aperture 29, with the extension 24 and the groove 22 extending beneath the lower end of the aperture 29 into the recess 28 (FIG. 4). An elongated rectangular keeper plate 30, having a square aperture 32 in its center, then is forced up onto the end of the projection 21, guided by the sloped surfaces 24, until the grooves 22 snap into place on the opposite edges of the aperture 32 in the plate 30. The plate 30 then captures the push-button switch operator 12 in the housing 11.

On opposite ends of the rectangular keeper plate 30, a pair of small square permanent magnets 34 and 35 are secured. These magnets 34 and 34 may be secured in the position shown in FIG. 1 by any suitable adhesive, or by integrally molding them into a part of the keeper 30, as desired. A pair of small square steel plates 36 (only one of which is shown in FIG. 4) are aligned with the magnets 34 and 35 on the underside of the central portion 27 of the housing 11 in the cavity 28; so that the magnets 34 and 35 pull the keeper plate 30 upwardly (and, therefore, the projection 21 and switch operator member or key top 12) until the magnets 34 and 35 engage the plates 36. This is the first normal position of the switch operator in its unoperated condition. When operation of the switch operator 12 is desired, it is depressed against the force of the magnets 34 and 35, which provide the feel and touch of a standard keyboard. The amount of force which is required to depress the operator 12 to its second or operated position is determined by the size and strength of the magnets 34 and 35 in conjunction with the metal plates 36. The plates 36 are secured to the underside of the housing 11 in the cavity 28 by means of a suitable adhesive or other technique, as desired.

The switch operator members 14, 16, 18 and 20, on the four sides of the base member 11, each are mounted on the top 41 of a corresponding elongated frame 40. In assembly, the lower end of each frame 40, which has a pair of outwardly extending projections 55 and 56 on it, is first tipped outwardly at an angle, with the lower end of the frame 40 being directed into an opening 60 between an outer plate 58 and an inner plate 59 at the bottom of each of the four sides of the base member 11 of the switch module. The projections 55 and 56 are moved past the inwardly sloping surface of a pair of holder plates 62 and 63, located on opposite sides of the walls extending perpendicularly outwardly from the main body portion of the base member 11 behind the members 59. The angle of the members 62 and 63, relative to the shape of the rear surface of the plate 58, is shown most clearly in FIG. 4.

The passageway for inserting the frame 40 permits the extensions 55 and 56 to pass beneath the lower edges of the holder plates 62 and 63. Once this has been accomplished, the frame 40 is tipped toward the center of the base member 11 to a substantially vertical position. At this time, the corresponding switch operator member or key top 14, 16, 18 or 20, is pressed downwardly over the top 41 to cause the top 41 to extend into a recess 43 (shown only for key switch operator member 20 in FIG. 2). A shoulder located beneath a relief area 45 in the elongated frame 40 engages the lower edge of the corresponding switch operator 14, 16, 18 or 20, which is placed on it. This is done with the frame 40 in its vertical position; so that the outer edges of the operating members 14, 16, 18 and 20 are located above a surface 64 on the top of the base member 11. The undercut outermost edges of the operating members 14, 16, 18 and 20 extend behind upward extensions 65, 66, 67 and 68 on the four corners of the member 11. These extensions limit the outward tilting movement, which is provided by pushing any of the switch operator members 14, 16, 18 or 20 outwardly from the center of the base member 11.

As with the central push-button switch operator 12/21, return bias for the switch operator members 14/40, 16/40, 18/40 and 20/40 is provided by means of magnets 50. These magnets are secured by means of a suitable adhesive or other means, between a pair of ribs 49 on the front faces of the frames 40 against rear extensions 47, located at the bottom of the reliefs or cutouts 45, shown clearly in conjunction with all four of the frames 40. The magnets 50 are secured in place between the ribs 49 in a flush position, similar to the position shown for the magnets 34 and 35 on the keeper 30, described, previously.

Since the base member 11 is made of non-magnetic plastic material, steel spring inserts 52 are placed over the top of the inner central walls on each side of the base member, and extend downwardly through apertures 51 extending parallel to the aperture 29 through the center of the base member 11. The apertures 51 are shown most clearly in FIG. 3, which is a top view of the molded plastic base member 11. With the steel spring members 52 located directly opposite each of the magnets 50, the magnets 50 draw the frames 40 inwardly to pivot them about their bottom edges, with the projections 55 and 56 extending under the bottom of the side members 62 and 63 to cause the magnets 50 to engage or nearly engage the spring steel extensions 52. Shoulders 57 extend over the tops of the holder plates 62 and 63. This is the normal or rest position of each of the switch operator members.

When any one of the switch operator members 14, 16, 18 or 20 is to be operated, the fingertip, which is located in the module in the center over the push-button central plunger 12, is moved to either side, forward or back, to operate the proper switch operator member. When this occurs, the switch operator member 14, 16, 18 or 20 is rocked or pivoted outwardly about the base or lower end of the frame 40 associated with it, to cause the operator member to pivot outwardly in the direction shown by the arrows in FIG. 1 to a second or operated position of the switch. This movement is the same for each of the four operating members 14, 16, 18 and 20.

It is readily apparent that operation is effected by means of a different portion of the fingertip for each of the switch operator members 14, 16, 18 and 20. Consequently, each switch operator member or "key" provides a discrete different tactile feedback to the index finger or other finger of an operator. This tactile feedback is differentiated from every other one of the operator members in the particular "well" created by the operating members 14, 16, 18 and 20. This facilitates learning the use of the switch, whether it is used in a keyboard or other device, and makes immediate error detection possible by the operator. In addition, this type of operation allows for tactile verification of switch actuation. The operator finger encounters a physically separate and individually moving key surface or switch operator member for each intended switch or key within the finger well. Additionally, each separate switch operator member contacts a separate part of the finger tip in the well, in which such switch operator member is located. For example, the operator member 14 touches the left side of the finger, operator member 18 the right side, operator member 12 the end, operator member 16 the front or upper side of the finger, and operator member 20 the back or bottom side of the finger. As a result, the operator is able readily to ascertain which separate operator member the finger is pressing against during operation of the switch assembly. This provides immediate verification to the operator, and opportunity to correct possible errors.

In order to provide a means for obtaining an output indicative of the state of operation of the various switch operator members, a pair of recesses 70 and 71 are located on opposite sides of the elongated frames 40 in the base member 11. These pairs of recesses 70 and 71 are provided for each of the operator members 14, 16, 18 and 20; and a similar arrangement (not shown) is provided in the cavity 28 on opposite sides of the keeper 30, which is snap fit onto the end of the projection 21 beneath the operator member 12, as described previously. In each of the recesses 70, a linear light source 80, such as a light-emitting diode or low power laser, is secured with the input and output leads extending downwardly out of the bottom of the base member 11, as shown most clearly in FIG. 1. On the opposite side, in the recess 71, a light-responsive device 81 such as a photocell or the like is secured, also with a pair of leads extending downwardly out of the bottom of the base member 11.

As stated previously, the devices 80 and 81 are secured near the upper parts of the recesses 70 and 71, respectively, for each of the switch operator members 14, 16, 18 and 20. When each of the switch operator members are attached toward the center of the base member 11 the frame 40 is moved by the magnet 50 to the position shown in FIG. 5. In this position, the material of the frame 40 is in the light path between the light source 80 and the light responsive device 81, blocking the path; so that no light reaches the device 81 This condition is indicated at the output leads of the device 81, and constitutes the normal or unoperated position of the particular switch operator member 14 16 18 or 20 which is associated with the particular frame 40, as shown in FIG. 5.

When the same switch operator member, however, is moved or pivoted outwardly, as described above, the frame 40 moves out of the light path, as shown in FIG. 6; so that the light projected from the source 80 moves across the space (now opened by the outward movement of the frame 40, as shown) to strike the photocell or other light-responsive device 81 in the cavity 71. This causes an electrical output, which is detected at the output leads of the device 71, and which may be used to indicate the movement or operation of the switch with which that particular light-responsive device 81 is associated. The electrical interconnections, which are used to effect this operation, are standard, and may be implemented to provide the desired output through a number of different circuits, including, but not limited to, the one disclosed in U.S. Pat. No. 4,913,573, to which reference already has been made.

The modular switch assembly which has been shown and described readily may be made of high impact molded plastic parts. There are no levers, hinges or other parts which are subject to any substantial wear. The magnets 34, 35 and 50 and the metal pieces 36 and 52 provide a spring-like function without the complicated assembly which is associated with springs. In addition, there are no springs to break, to cause subsequent failure of the switches of the assembly. It also should be noted that by changing the strength of the various magnets 34, 35, the force required to operate the various operator members of the switch assembly may be varied to provide a "touch" suited for different operators. For "heavy-handed" operators, relatively strong magnets may be employed; so that accidental operation of the switches does not occur. For other operators, however, a light touch is desired. This readily can be accommodated, by providing modular switch assemblies with magnets of different strengths to provide the desired "feel".

The foregoing description of the preferred embodiment of the invention should be considered as illustrative, and not as limiting. The particular specific configuration of the base member, and the other parts which are assembled into the modular switch assembly may be varied without departing from the manner in which these parts function. Similarly, the materials used may be determined by the particular application required for the switch when it is incorporated into other apparatus, such as a control panel, keyboard or the like. Various other changes and modifications will occur to those skilled in the art, without departing from the true scope of the invention as defined in the appended claims.

I claim:

1. A switch assembly including in combination:

a base member having a central core;

a plurality of switch operator members located at predetermined positions about said core and each carried by said base member and each movable from a first position to a second position;

magnetic biasing means for normally maintaining each of said switch operator members in a first position thereof and for returning each of said switch operator members to the first position thereof after release of said switch operator members following movement to the second position thereof; and a plurality of signal output devices, each associated with a corresponding one of said switch operator members for providing an output indicia representative of the position of the corresponding switch operator member.

2. The combination according to claim 1 wherein said base member has a top surface and said plurality of switch operator members comprises at least two switch operator members located on opposite sides of said base member and extending above said top surface for operation by movement of a finger located between said switch operator members.

3. The combination according to claim 2 wherein said plurality of switch operator members comprises at least four switch operator members located about the periphery of said base member at 90° intervals, each of said switch operator members extending above said top surface of said base member for operation by the finger of a person inserted in the space surrounded by said four operator members, said operator members in the first position thereof being oriented substantially vertically and in the second position thereof being pivoted outwardly a predetermined number of degrees from the first position thereof.

4. The combination according to claim 3 wherein said signal output device for each said plurality of switch operator members comprises a light source and a light responsive receiver linearly aligned with one another on opposite sides of each of said switch operator members, with the light path being blocked when the corresponding switch operator member is in one of the first and second positions thereof, and being opened when said corresponding switch operator member is in the other of the first and second positions thereof.

5. The combination according to claim 4 wherein the light path between each set of said light sources and light responsive receivers is blocked when the corresponding switch operator member is in the first position thereof and is open for reception of light by the light responsive receiver from the associated light source when the corresponding switch operator member is in the second position thereof.

6. The combination according to claim 5 wherein each of said plurality of said movable switch operator members comprises a cap and an elongated frame, with the elongated frame having a top end and a bottom end, with the bottom end thereof pivotally mounted on said base member and the cap mounted on the top end of said frame with said base member including extensions for limiting the extent of pivotal movement of each of said switch operator members from the first position thereof to the second position thereof, thereby defining said first and second positions.

7. The combination according to claim 6 wherein said base member is made of molded plastic material and said magnetic biasing means comprises a magnet mounted on one of each of said movable switch operator members and said base member, and magnetic material located in aligned proximity with said magnet on the other of said base member and each of said switch operator members, such that magnetic attraction between said magnet and said magnetic material biases each of said switch operator members to the first position thereof.

8. The combination according to claim 1 wherein said base member has at least four sides, a top and a bottom, with a central one of said plurality of said movable switch operator members located on the top of said base member, and with others of said plurality of movable switch operator members comprising at least first and second switch operator members located on diametrically opposite ones of the four sides of said base member, said central switch operator member including means for magnetically biasing said switch operator member to a predetermined position above the top of said base member for the first position thereof, and being depressed toward said base member for the second position thereof, with said first and second switch operator members on said diametrically opposite sides of said base member each having a portion extending above the top of said central switch operator member for contact by a finger located above said central switch operator member for pivotal movement outwardly from the first position to the second position thereof.

9. The combination according to claim 1 wherein said signal output device for each said plurality of switch operator members comprises a light source and a light responsive receiver linearly aligned with one another on opposite sides of each of said switch operator members, with the light path being blocked when the corresponding switch operator member is in one of the first and second positions thereof, and being opened when said corresponding switch operator member is in the other of the first and second positions thereof.

10. The combination according to claim 9 wherein the light path between each set of said light sources and light responsive receivers is blocked when the corresponding switch operator member is in the first position thereof and is open for reception of light by the light responsive receiver from the associated light source when the corresponding switch operator member is in the second position thereof.

11. The combination according to claim 1 wherein each of said plurality of said movable switch operator members comprises a cap and an elongated frame, with the elongated frame having a top end and a bottom end, with the bottom end thereof pivotally mounted on said base member and the cap mounted on the top end of said frame with said base member including extensions for limiting the extent of pivotal movement of each of said switch operator members from the first position thereof to the second position thereof, thereby defining said first and second positions.

12. The combination according to claim 11 wherein said signal output device for each said plurality of switch operator members comprises a light source and a light responsive receiver linearly aligned with one another on opposite sides of each of said switch operator members, with the light path being blocked when the corresponding switch operator member is in one of the first and second positions thereof, and being opened when said corresponding switch operator member is in the other of the first and second positions thereof.

13. The combination according to claim 12 wherein the light path between each set of said light sources and light responsive receivers is blocked when the corresponding switch operator member is in the first position thereof and is open for reception of light by the light responsive receiver from the associated light source when the corresponding switch operator member is in the second position thereof.

14. The combination according to claim 13 wherein said base member is made of molded plastic material and said magnetic biasing means comprises a magnet mounted on one of each of said movable switch operator members and said base member, and magnetic material located in aligned proximity with said magnet on the other of said base member and each of said switch operator members, such that magnetic attraction between said magnet and said magnetic material biases each of said switch operator members to the first position thereof.

15. The combination according to claim 1 wherein said plurality of switch operator members comprises at least four switch operator members located about the periphery of said base member at 90° intervals, each of said switch operator members extending above said top surface of said base member for operation by the finger of a person inserted in the space surrounded by said four operator members, said operator members in the first position thereof being oriented substantially vertically and in the second position thereof being pivoted outwardly a predetermined number of degrees from the first position thereof.

16. The combination according to claim 15 wherein said base member is made of molded plastic material and said magnetic biasing means comprises a magnet mounted on one of each of said movable switch operator members and said base member, and magnetic material located in aligned proximity with said magnet on the other of said base member and each of said switch operator members, such that magnetic attraction between said magnet and said magnetic material biases each of said switch operator members to the first position thereof.

17. The combination according to claim 1 wherein said base member has a top surface and said plurality of switch operator members comprises at least two switch operator members located on opposite sides of said base member and extending above said top surface for operation by movement of a finger located between said switch operator members.

18. The combination according to claim 1 wherein said base member is made of molded plastic material and said magnetic biasing means comprises a magnet mounted on one of each of said movable switch operator members and said base member, and magnetic material located in aligned proximity with said magnet on the other of said base member and each of said switch operator members, such that magnetic attraction between said magnet and said magnetic material biases each of said switch operator members to the first position thereof.

19. A switch assembly including in combination:

a base member having a central core;

a plurality of switch operator members located at predetermined positions about said core and each carried by said base member and each movable from a first position to a second position;

biasing means for normally maintaining each of said switch operator members in a first position thereof and for returning each of said switch operator members to the first position thereof after release of said switch operator members following movement to the second position thereof; and a plurality of signal output devices, each associated with a corresponding one of said switch operator members for providing an output indicia representative of the position of the corresponding switch operator member.

20. The combination according to claim 19 wherein said base member has a top surface and said plurality of switch operator members comprises at least two switch operator members located on opposite sides of said base member and extending above said top surface for operation by movement of a finger located between said switch operator members.

* * * * *